(12) United States Patent
Johnston et al.

(10) Patent No.: US 11,988,621 B2
(45) Date of Patent: May 21, 2024

(54) THERMAL INTERFACE MATERIAL DETECTION THROUGH AN ELECTRICAL CONDUCTIVITY TEST

(71) Applicant: INTERNATIONAL BUSINESS MACHINES CORPORATION, Armonk, NY (US)

(72) Inventors: Shawn Matthew Johnston, Rochester, MN (US); Clinton William Erie, Adams, MN (US); Ryan Paske, Oronoco, MN (US); Steven Charles Erickson, Rochester, MN (US); Michael John MacPherson, Elgin, MN (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 17/445,099

(22) Filed: Aug. 16, 2021

(65) Prior Publication Data
US 2023/0049585 A1 Feb. 16, 2023

(51) Int. Cl.
G01N 25/18 (2006.01)
F28D 15/00 (2006.01)
F28D 21/00 (2006.01)

(52) U.S. Cl.
CPC ............ *G01N 25/18* (2013.01); *F28D 15/00* (2013.01); *F28D 2021/0029* (2013.01)

(58) Field of Classification Search
CPC . G01N 25/18; F28D 15/00; F28D 2021/0029; G01B 7/08
See application file for complete search history.

(56) References Cited

U.S. PATENT DOCUMENTS 6,491,426 B1 12/2002 Schonath
6,896,405 B2 5/2005 Osone
(Continued)

FOREIGN PATENT DOCUMENTS

EP 3712591 A1 9/2020

OTHER PUBLICATIONS

MEPTEC Report, Fall 2015 (pp. 18-20) "Thermal Test Chips: Versatile Characterization Tool"—MEPTEC; The temperature sensing element can be a resistor with a well-defined resistance-temperature relationship [like a thermistor or RTD (Resistive Temperaturedependent Device)] or a semiconductor junction also having a well-defined Forward Voltage (VF)—Junction Temperature (TJ) relationship, https://meptec.org/Resources/MTRpt%20Fall%202015%204%20Download.pdf.

*Primary Examiner* — Raheena R Malik
(74) *Attorney, Agent, or Firm* — Tihon Poltavets (57) ABSTRACT

An apparatus for thermal interface material detection includes a heat dissipating device stack up that includes a heat dissipating device, a thermal interface material, a heat generating component, and a printed circuit board. The heat dissipating device is disposed on the thermal interface material, the thermal interface material is disposed on the heat generating component, and the heat generating component is disposed on the printed circuit board. A channel in a body of the heat dissipating device includes an embedded conductive probe, where a first end of the embedded conductive probe leads to a lower surface of the body of the heat dissipating device and a second end of the embedded conductive probe leads to an upper surface of the body of the heat dissipating device.

16 Claims, 6 Drawing Sheets

(56) References Cited

U.S. PATENT DOCUMENTS

| | | | |
|---|---|---|---|
| 7,523,617 B2 | 4/2009 | Venkatasubramanian | |
| 7,764,069 B2 * | 7/2010 | Gaynes | G01B 7/08 |
| | | | 324/662 |
| 8,013,024 B2 | 9/2011 | Chung | |
| 8,026,730 B2 * | 9/2011 | Gaynes | G01B 7/08 |
| | | | 324/662 |
| 8,350,263 B2 | 1/2013 | Oda | |
| 8,589,102 B2 | 11/2013 | Chainer | |
| 9,170,222 B2 * | 10/2015 | Megarity | H01L 23/34 |
| 9,316,603 B2 * | 4/2016 | Megarity | G01N 25/18 |
| 10,281,521 B2 | 5/2019 | Song | |
| 2011/0101349 A1 * | 5/2011 | Oda | H01L 24/92 |
| | | | 257/E23.08 |
| 2012/0053874 A1 * | 3/2012 | Chainer | G01N 27/228 |
| | | | 702/65 |
| 2023/0049585 A1 * | 2/2023 | Johnston | G01N 25/18 |

* cited by examiner

THERMAL INTERFACE MATERIAL DETECTION THROUGH AN ELECTRICAL CONDUCTIVITY TEST

BACKGROUND

This disclosure relates generally to thermal interface material detection, and in particular, to detecting thermal interface material between a heat generating component and a heat dissipating component.

An electronic module is an example of a heat producing device that typically requires a heat dissipating device, such as, a heat sink or cold plate. When attaching the heat dissipating device to the heat producing device, a various types of thermal interface material can be utilized to provide efficient thermal coupling between the heat dissipating device and the heat generating device. The thermal interface material provides a critical function to the overall thermal management design of various electronic components. In a high-volume manufacturing setting, the application of the thermal interface material can be overlooked during the assembly process, since the thermal interface material is a typically a component with no data collection fields displayed on barcodes.

SUMMARY

A first aspect of an embodiment of the present invention discloses an apparatus for thermal interface material detection, the apparatus comprising a heat dissipating device stack up includes a heat dissipating device, a thermal interface material, a heat generating component, and a printed circuit board. The apparatus further comprises the heat dissipating device disposed on the thermal interface material, the thermal interface material disposed on the heat generating component, and the heat generating component disposed on the printed circuit board. The apparatus further comprises a channel in a body of the heat dissipating device with an embedded conductive probe, wherein a first end of the embedded conductive probe leads to a lower surface of the body of the heat dissipating device and a second end of the embedded conductive probe leads to an upper surface of the body of the heat dissipating device.

A second aspect of an embodiment of the present invention discloses an apparatus for thermal interface material detection, the apparatus comprising a heat dissipating device stack up includes a heat dissipating device, a thermal interface material, a heat generating component, and a printed circuit board, wherein the heat dissipating device is electrically conductive. The apparatus further comprises the heat dissipating device disposed on the thermal interface material, the thermal interface material disposed on the heat generating component, and the heat generating component disposed on the printed circuit board. The apparatus further comprises a probe pin protruding from a top surface of the printed circuit board positioned beneath a portion of the thermal interface material, wherein the probe pin is electrically conductive and the thermal interface material is nonconductive.

A third aspect of an embodiment of the present invention discloses a method for detecting the presence of thermal interface material, the method comprising providing a heat dissipating device stack up, wherein the heat dissipating device stack up includes a heat dissipating device disposed on a thermal interface material, and the thermal interface material disposed on a heat generating component. The method further comprises attaching a first lead of a multimeter to a conductive probe embedded in the heat dissipating device and a second lead of the multimeter to the heat dissipating device. The method further comprises verifying the presences of the thermal interface material based on a resistance reading by the multimeter.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Embodiments of the present invention provide a heat dissipating device with an embedded conductive probe and a process for detecting thermal interface material positioned between the heat dissipating device and a heat generating component. The heat dissipating device is disposed on a top surface of the heat generating component, where the thermal interface material is positioned between a lower surface of the heat dissipating device and the top surface of the heat generating component to provide thermal coupling. Presently, a common issue in high volume manufacturing is that thermal interface material can be imprecisely applied between the heat dissipating device and the heat generating component unit or missed altogether, resulting in insufficient thermal coupling. Due to the size of the heat dissipating device and a thickness of the thermal interface material applied to the top surface of the heat generating component, a visual verification after assembly of the heat dissipating device stack up is difficult. If thermal issues are found subsequent to assembly, visual verification is difficult without physically removing the heatsink or cold plate and is prone to human error due to the nature of visual verifications.

Certain process-related solutions, such as, pre-kitting the components prior to assembly of the heat dissipating device stack up are also prone to errors and do not provide verification of the thermal interface material between the heat dissipating device and the heat generating component.

Assessing a height of the heat dissipating device stack up provides an inaccurate verification of thermal interface material due to the tolerances on the heat dissipating device dimensions and stack up, where the small thickness of the thermal interface material and the tolerances hide the dimensions of the thermal interface thickness. Monitoring thermal performance during an operational test can provide a partial solution via a detection of a heat dissipation issue but does not provide the verification of the presences of thermal interface material. As a result, the verification of the presences of thermal interface material is typically performed utilizing a potentially destructive and costly disassembly of the heat dissipating device stack up.

Embodiments of the present invention utilize a conductive probe embedded in a heatsink or cold plate (i.e., heat dissipating device) for presences detection of thermal interface material. The conductive probe can be positioned from either a top surface of the heat dissipating device or a side surface of the heat dissipating device, where a leading end of the conductive probe is at least partially flush with a lower surface of the heat dissipating device for contacting a mounting surface. The mounting surface includes a thermal interface material disposed on a heat generating device. The conductive probe is electrically insulated from the heat dissipating device, so there is no electrical conductivity between the conductive probe and the heat dissipating device. When an electrically conductive thermal interface material is disposed on a top surface of a nonconductive heat generating device, a resistance measurement between the conductive probe and the heat dissipating device should provide a near zero resistance value (i.e., ≈0Ω) when the thermal interface material is present and a high resistance value when the thermal interface material is not present. When a nonelectrically conductive thermal interface material is disposed on a top surface of an electrically conductive heat generating device or substrate, a resistance measurement between the conductive probe and the heat dissipating device should provide a large resistance value (i.e., ≈∞Ω) when the thermal interface material is present and a low resistance value when the thermal interface material is not present.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 1:
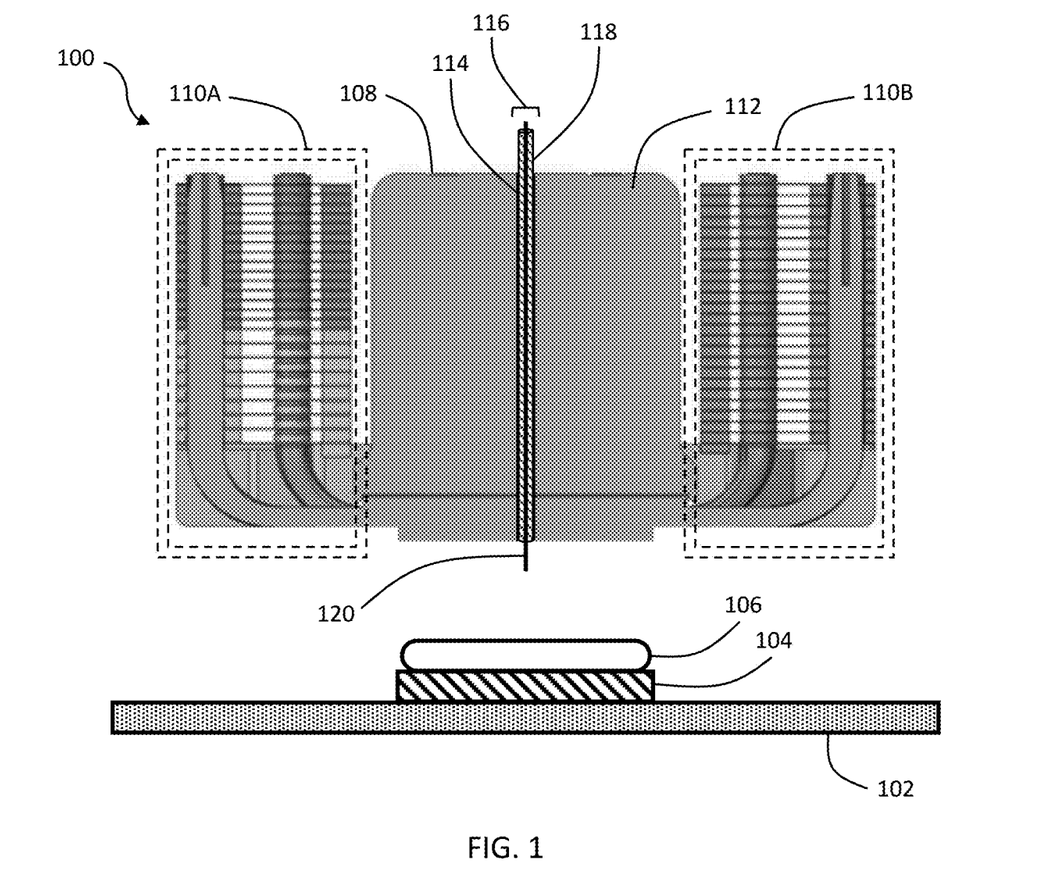
FIG. 1 depicts a side cutaway view of a heat dissipating device with a conductive probe prior to mounting to a heat generating component, in accordance with an embodiment of the present invention.

FIG. 1 depicts a side cutaway view of a heat dissipating device with a conductive probe prior to mounting to a heat generating component, in accordance with an embodiment of the present invention. In this embodiment, heat dissipating device stack up 100 includes printed circuit board 102 with heat generating component 104 disposed on printed circuit board 102. A central processing unit (CPU), also known as a processor, is one example of heat generating component 104 disposed on printed circuit board 102 that requires heat dissipation when operational. Thermal interface material 106 is disposed on a top surface of heat generating component 104, where thermal interface material 106 provides thermal coupling between heat generating component 104 and heat dissipating device 108. Heat dissipating device 108 can be a heatsink, a cold plate, and/or a structure capable of dissipating heat when thermally coupled to heat generating component 104. Thermal interface material 106 can be any material (solid, grease, and/or gel) insertable between two components to enhance thermal coupling between the two components. Heat dissipating device 108 includes fin assembly 110A and 110B each positioned on a side of body 112, where fin assembly 110A and 110B each includes a plurality of fins and heat pipes for dissipating heat from heat generating component 104.

Heat dissipating device 108 is modified to include channel 114 situated between a top surface of body 112 and a bottom surface of body 112 of heat dissipating device 108, where channel 114 is a pass-through between the top surface and the bottom surface of body 112. In this embodiment, FIG. 1 illustrates a cutaway of heat dissipating device 108 with channel 114, where the channel 114 is positioned in the center of body 112 aligned with a center of heat generating component 104. In another embodiment, channel 114 is situated between a side of body 112 and a bottom surface of body 112 of heat dissipating device, where the channel 114 is positioned at an angle (e.g., 45°) relative to a top surface of thermal interface material 106. Channel 114 includes embedded conductive probe 116 with insulation 118 and pin 120, where insulation 118 ensures that electrically conductive pin 120 does not contact the walls of channel 114. Pin 120 is spring-loaded within insulation 118, where pin 120 retracts into insulation 118 upon contacting a surface beneath body 112 of heat dissipating device 108. If thermal interface material 106 is present, a first end of pin 120 contacts a top surface of thermal interface material 106 and retracts into insulation 118 of conductive probe 116. If thermal interface material 106 is not present, a first end of pin 120 contacts a top surface of heat generating component 104 and retracts into insulation 118 of conductive probe 116. A force exerted by the spring-loaded pin 120 is such that neither thermal interface material 106 nor heat generating component 104 is damaged.

Figure 2:
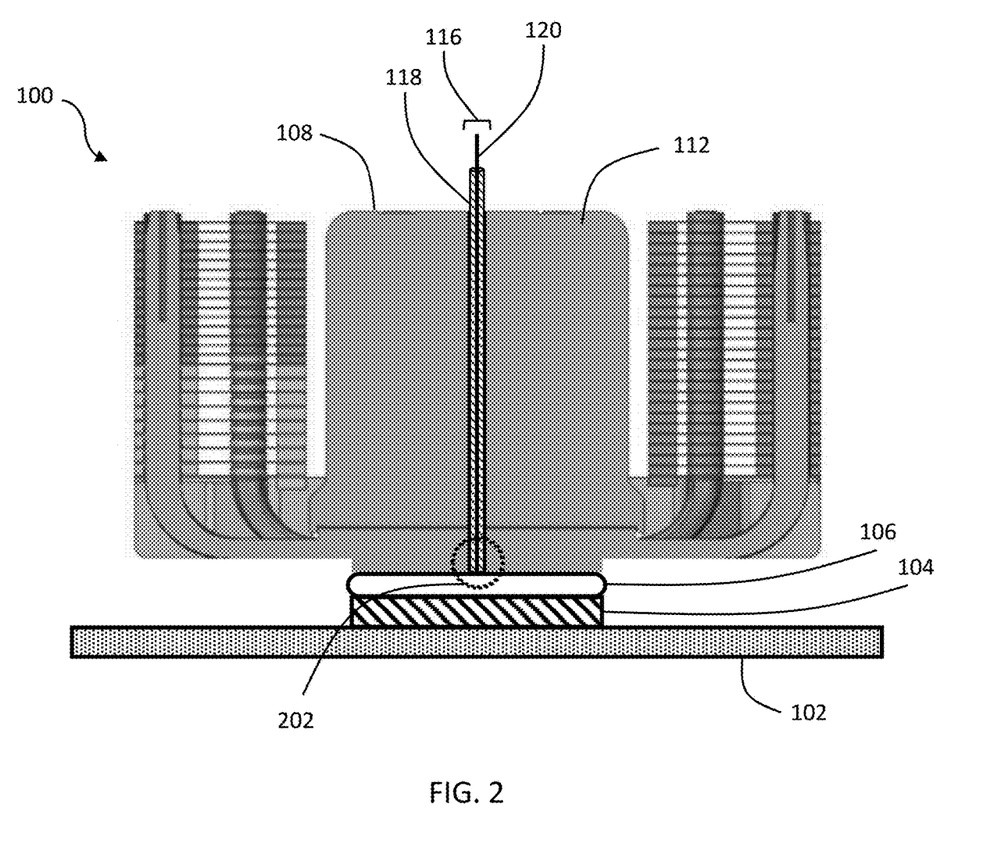
FIG. 2 depicts a side cutaway view of a heat dissipating device with a conductive probe mounted on a heat generating component, in accordance with an embodiment of the present invention.

FIG. 2 depicts a side cutaway view of a heat dissipating device with a conductive probe mounted on a heat generating component, in accordance with an embodiment of the present invention. In this embodiment, heat dissipating device stack up 100 includes heat dissipating device 108 in a final position on heat generating component 104, where thermal interface material 106 thermally couples body 112 of heat dissipating device 108 to heat generating component 104. As heat dissipating device 108 is pressed onto thermal interface material 106 disposed on a top surface of heat generating component 104 on printed circuit board 102, thermal interface material 106 compresses under the weight and force exerted by a lower surface of body 112 of heat dissipating device 108. As thermal interface material 106 compresses under heat dissipating device 108, a height of thermal interface material 106 decreases and thermal interface material 106 further spreads to cover a greater area of the top surface of heat generating component 104. An amount of thermal interface material 106 utilized is such that the spreading does not exceed the area of the top surface of heat generating component 104 to avoid spill over onto the side of heat generating component 104 and/or printed circuit board 102. As previously discussed, pin 120 is spring-loaded within insulation 118 and as body 112 of heat dissipating device 108 is pressed onto heat generating component 104 with thermal interface material 106 at area 202, pin 120 retracts into the first end of conductive probe 116. The retracting of pin 120 into the first end of conductive probe 116 results in pin 120 protruding from a second end of conductive probe 116.

Figure 3:
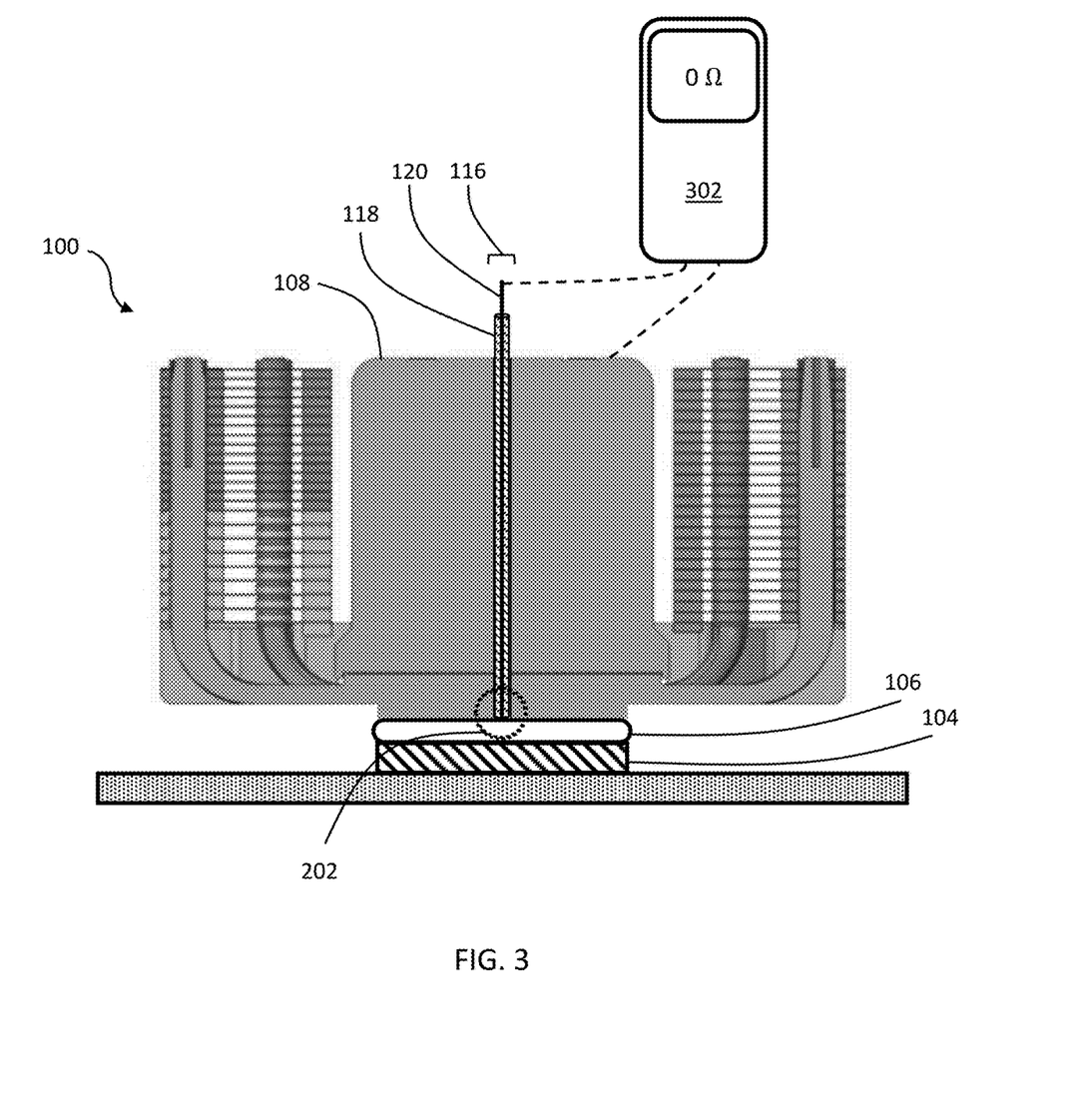
FIG. 3 depicts a side cutaway view of a heat dissipating device mounted on a nonconductive heat generating component with an electrically conductive thermal interface material, in accordance with an embodiment of the present invention.

FIG. 3 depicts a side cutaway view of a heat dissipating device mounted on a nonconductive heat generating component with an electrically conductive thermal interface material, in accordance with an embodiment of the present invention. In this embodiment, heat dissipating device stack up 100 includes heat dissipating device 108 thermally coupled to a nonconductive heat generating component 104 utilizing an electrically conductive thermal interface material 106. In area 202 of heat dissipating device stack up 100, a first end of the electrically conductive pin 120 of conductive probe 116 contacts a top surface of the electrically conductive thermal interface material 106 and a second end of the electrically conductive pin 120 is temporarily electrically coupled to first lead of multimeter 302. A second lead of multimeter 302 is temporarily electrically coupled to heat dissipating device 108, where heat dissipating device 108 is electrically conductive. To verify the presence of thermal interface material 106, a resistance measurement between pin 120 of conductive probe 116 and heat dissipating device 108 should provide a near zero resistance value (i.e., ≈0Ω). However, if a resistance measurement between pin 120 of conductive probe 116 and heat dissipating device 108 is a high value (e.g., >1Ω), thermal interface material 106 is not present or partially present between heat dissipating device 108 and nonconductive heat generating component 104. A resistance measurement break point for what is considered a high value can be established on a case-by-case basis for each application.

Figure 4:
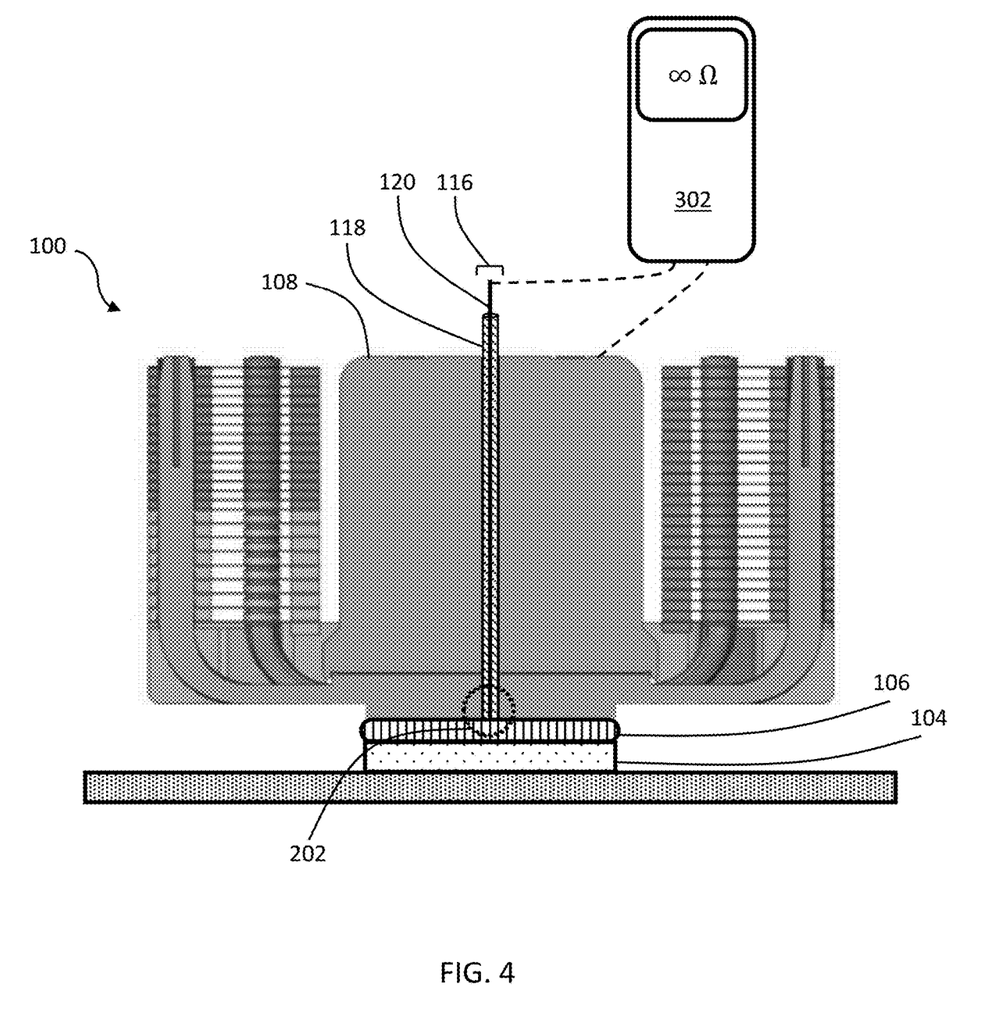
FIG. 4 depicts a side cutaway view of a heat dissipating device mounted on a conductive heat generating component with a nonconductive thermal interface material, in accordance with an embodiment of the present invention.

FIG. 4 depicts a side cutaway view of a heat dissipating device mounted on a conductive heat generating component with a nonconductive thermal interface material, in accordance with an embodiment of the present invention. In this embodiment, heat dissipating device stack up 100 includes heat dissipating device 108 thermally coupled to an electrically conductive heat generating component 104 utilizing a nonconductive thermal interface material 106. In area 202 of heat dissipating device stack up 100, a first end of the electrically conductive pin 120 of conductive probe 116 contacts a top surface of the nonconductive thermal interface material 106 and a second end of the electrically conductive pin 120 is temporarily electrically coupled to first lead of multimeter 302. A second lead of multimeter 302 is temporarily electrically coupled to heat dissipating device 108, where heat dissipating device 108 is electrically conductive. To verify the presence of thermal interface material 106, a resistance measurement between pin 120 of conductive probe 116 and heat dissipating device 108 should provide a large resistance value (i.e., ≈∞Ω). However, if a resistance measurement between pin 120 of conductive probe 116 and heat dissipating device 108 is a low value (e.g., <1Ω), thermal interface material 106 is not present or partially present between heat dissipating device 108 and conductive heat generating component 104. A resistance measurement break point for what is considered a low value can be established on a case-by-case basis for each application.

Figure 5:
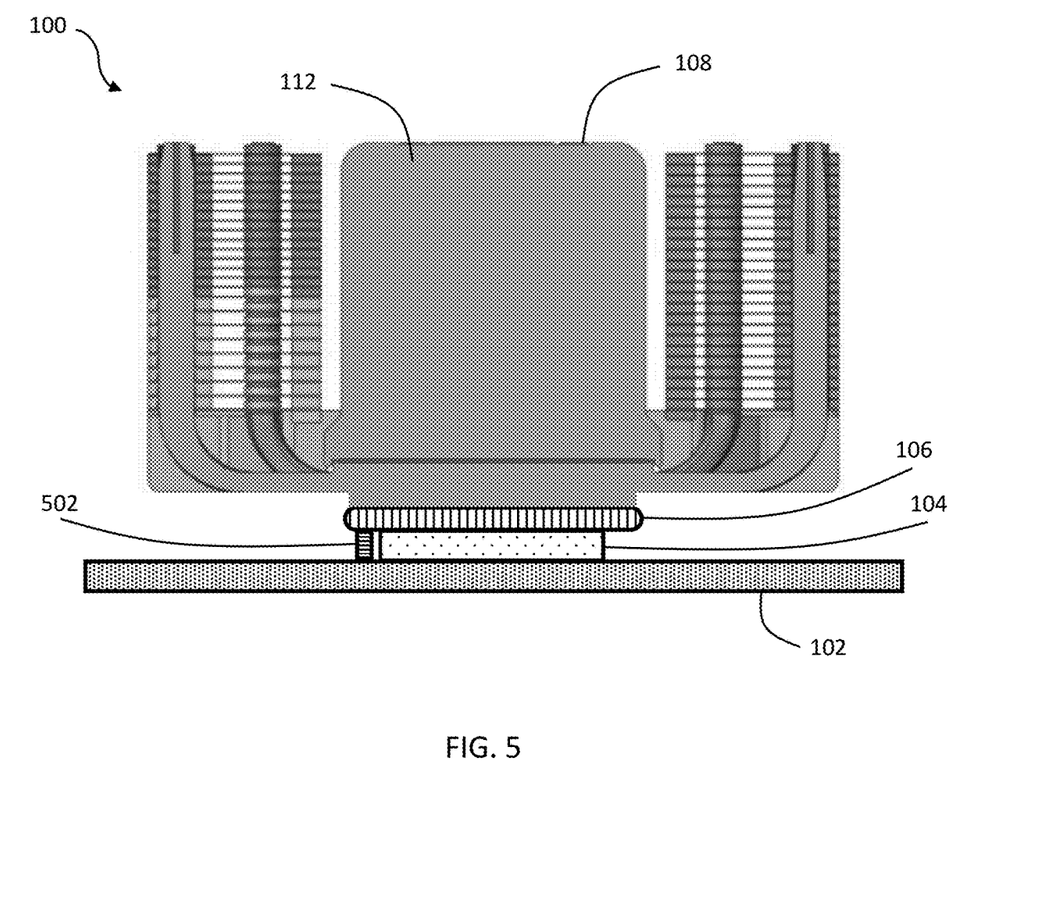
FIG. 5 depicts a side view of a heat dissipating device mounted on a heat generating component with a ground for contacting a nonconductive thermal interface material, in accordance with an embodiment of the present invention.

FIG. 5 depicts a side view of a heat dissipating device mounted on a heat generating component with a ground for contacting a nonconductive thermal interface material, in accordance with an embodiment of the present invention. In this embodiment, heat dissipating device stack up 100 includes an electrically conductive heat dissipating device 108 in a final position on an electrically conductive heat generating component 104, where nonconductive thermal interface material 106 thermally couples body 112 of heat dissipating device 108 to heat generating component 104. As heat dissipating device 108 is pressed onto thermal interface material 106 disposed on a top surface of heat generating component 104 on printed circuit board 102, thermal interface material 106 compresses under the weight and force exerted by a lower surface of body 112 of heat dissipating device 108. Probe pin 502 protrudes out of a top surface of printed circuit board 102, where probe pin 502 is positioned beneath a portion of thermal interface material 106 and heat dissipating device 108. To verify the presence of thermal interface material 106, printed circuit board 102 is powered on and a contact ground is absent at probe pin 502 between printed circuit board 102 and the nonconductive thermal interface material 106. However, if a contact ground at probe pin 502 is present, probe pin 502 has contacted a lower surface of body 112 of electrically conductive heat dissipating device 108 due to an absence of thermal interface material 106. Contact ground at probe pin 502 can result in printed circuit board 102 being powered down or a system error being generated for heat dissipating device stack up 100.

Figure 6:
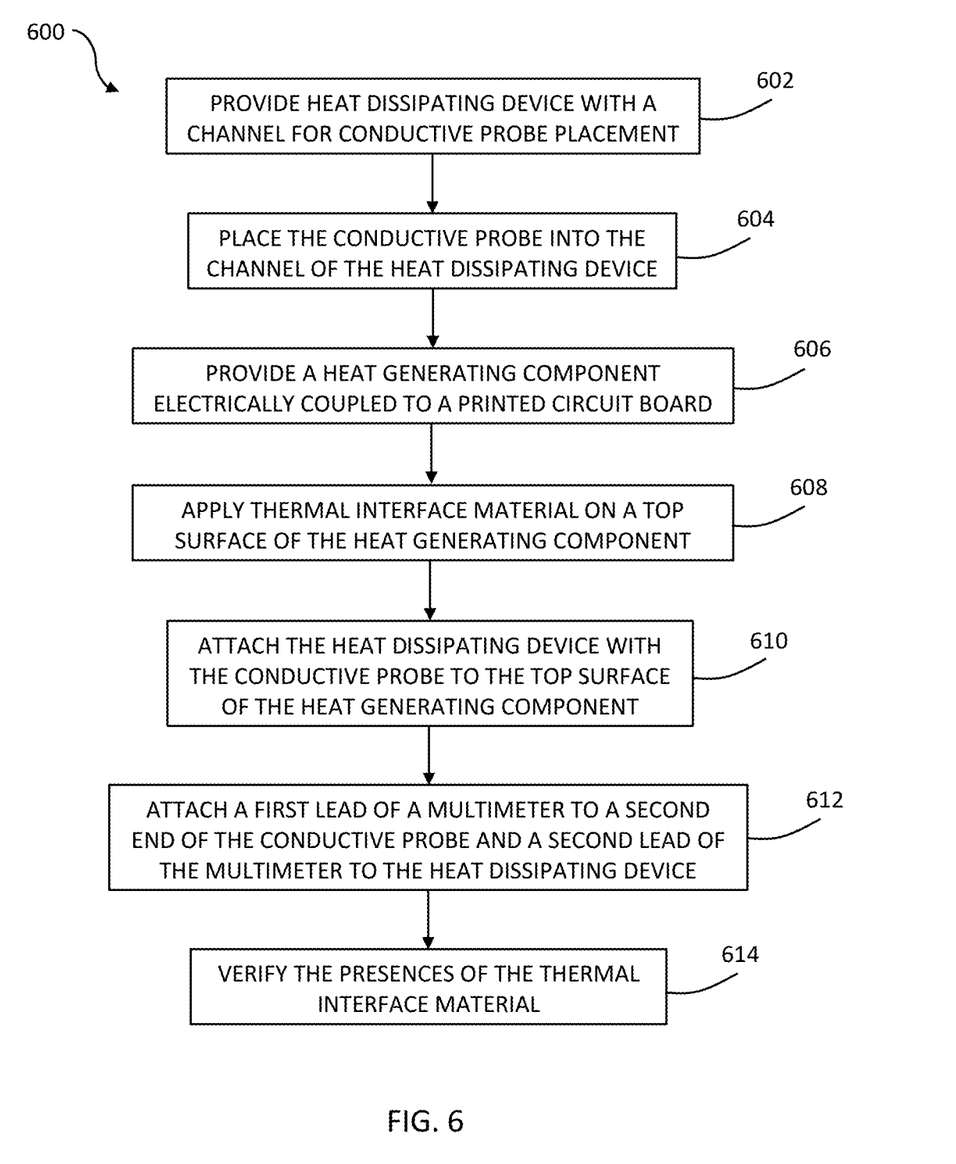
FIG. 6 depicts a process for verifying presence of thermal interface material utilizing a conductive probe, in accordance with an embodiment of the present invention.

FIG. 6 depicts a process for verifying presence of thermal interface material utilizing a conductive probe, in accordance with an embodiment of the present invention. Detection process 600 representing a thermal interface material (TIM) verification process for a heat generating device stack up assembly, where the thermal interface material thermally couples a heat dissipating device (e.g., heatsink, cold plate) and a heat generating component. Detection process 500 includes providing a heat dissipating device with a channel for conductive probe placement (602). The heat dissipating device provided is as described with regards to FIGS. 1-4, where the heat dissipating device includes a channel for an embedded conductive probe. The heat dissipating device can be molded with the channel and/or the heat dissipating device can be drilled to create the channel, where the channel is a pass-through from a top surface or a side surface, to a bottom surface of a body of the heat dissipating device. Detection process 600 further includes placing the conductive probe into the channel of the heat dissipating device (604), where the conductive probe includes an electrically conductive pin disposed in an insulated sleeve. The insulated sleeve isolates the electrically conductive pin from contacting the electrically conductive heat dissipating device.

Detection process 600 further includes providing a heat generating component electrically coupled to a printed circuit board (606) and applying a thermal interface material on a top surface of the heat generating component (608). The thermal interface material can be a solid, grease, and/or gel, and is meant to be spreadable and/or placeable on the top surface of the heat generating component. Detection process 500 further includes attaching the heat dissipating device to the top surface of the heat generating component (610). As previously discussed, the conductive probe is embedded in heat dissipating device, where a first end of the conductive pin protrudes out of the insulated sleeve. The conductive pin is spring-loaded within the insulated sleeve, where the conductive pin retracts into the insulated sleeve upon contacting a surface beneath the heat dissipating device. If thermal interface material is present, the first end of the conductive pin contacts a top surface of the thermal interface material and retracts into the insulation sleeve of the conductive probe. If thermal interface material is not present, the first end of conductive pin contacts a top surface of the heat generating component and retracts into the insulation sleeve of the conductive probe. A force exerted by the spring-loaded conductive pin is such that neither the thermal interface material nor the heat generating component is damaged.

Detection process 600 further includes attaching a first lead of a multimeter to a second end of the conductive probe and a second lead of the multimeter to the heat dissipating device (612) and verifying the presences of the thermal interface material (614). When an electrically conductive thermal interface material is disposed on a top surface of a nonconductive heat generating device, a resistance measurement between the conductive probe and the electrically conductive heat dissipating device should provide a near zero resistance value when the thermal interface material is present and a high resistance value when the thermal interface material is not present. When a nonelectrically conductive thermal interface material is disposed on a top surface of an electrically conductive heat generating device or substrate, a resistance measurement between the conductive probe and the electrically conductive heat dissipating device should provide a large resistance value when the thermal interface material is present and a low resistance value when the thermal interface material is not present.

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. An apparatus comprising:
    a heat dissipating device stack up includes a heat dissipating device, a thermal interface material, a heat generating component, and a printed circuit board;
    the heat dissipating device disposed on the thermal interface material, the thermal interface material disposed on the heat generating component, and the heat generating component disposed on the printed circuit board, wherein the thermal interface material is electrically conductive and the heat generating component is electrically nonconductive; and
    a channel in a body of the heat dissipating device with an embedded conductive probe, wherein a first end of the embedded conductive probe leads to a lower surface of the body of the heat dissipating device and a second end of the embedded conductive probe leads to an upper surface of the body of the heat dissipating device.

2. The apparatus of claim 1, wherein the embedded conductive probe includes an insulation sleeve disposed in the channel and an electrically conductive pin disposed in the insulation sleeve.

3. The apparatus of claim 2, wherein the heat dissipating device is electrically conductive.

4. The apparatus of claim 3, wherein the electrically conductive pin of the embedded conductive probe is spring-loaded and configured to retract into the insulation sleeve upon a first end of the electrically conductive pin contacting a surface beneath the heat dissipating device.

5. The apparatus of claim 4, wherein the surface is a top surface of the thermal interface material.

6. The apparatus of claim 5, further a comprising:
    a first lead of a multimeter configured to temporarily electrically couple to a second end of the electrically conductive pin of the embedded conductive probe; and
    a second lead of the multimeter configured to temporarily electrically couple to the heat dissipating device.

7. An apparatus comprising:
    a heat dissipating device stack up includes a heat dissipating device, a thermal interface material, a heat generating component, and a printed circuit board, wherein the heat dissipating device is electrically conductive;
    the heat dissipating device disposed on the thermal interface material, the thermal interface material disposed on the heat generating component, and the heat generating component disposed on the printed circuit board, wherein the thermal interface material is electrically conductive and the heat generating component is electrically nonconductive; and
    a probe pin protruding from a top surface of the printed circuit board positioned beneath a portion of the thermal interface material, wherein the probe pin is electrically conductive.

8. The apparatus of claim 7, the probe pin configured to contact a lower surface of the heat dissipating device in an absence of the thermal interface material.

9. The apparatus of claim 8, wherein the probe pin is configured to create an electrical ground between the printed circuit board and the heat dissipating device in the absence of the thermal interface material.

10. A method comprising:
provoiding a heat dissipating device stack up, wherein the heat dissipating device stack up includes a heat dissipating device disposed on a thermal interface material, and the thermal interface material disposed on a heat generating component, wherein the thermal interface material is electrically conductive and the heat generating component is electrically nonconductive;
attaching a first lead of a multimeter to a conductive probe embedded in the heat dissipating device and a second lead of the multimeter to the heat dissipating device; and
verifying a presences of the thermal interface material based on a resistance reading by the multimeter.

11. The method of claim 10, wherein providing the heat dissipating device stack up further comprises:
providing the heat dissipating device with a channel;
placing the conductive probe into the channel;
providing the heat generating component electrically coupled to a printed circuit board;
applying the thermal interface material to a top surface of the heat generating component; and
attaching the heat dissipating device to the top surface of the heat generating component.

12. The method of claim 11, wherein the conductive probe includes an insulation sleeve disposed in the channel and an electrically conductive pin disposed in the insulation sleeve.

13. The method of claim 12, wherein the heat dissipating device is electrically conductive.

14. The method of claim 13, wherein attaching the first lead of the multimeter to the conductive probe further comprises:
attaching the first lead of the multimeter to a second end of the electrically conductive pin, wherein a first end of the electrically conductive pin contacts a surface beneath the heat dissipating device.

15. The method of claim 14, wherein the surface is a top surface of the thermal interface material.

16. The method of claim 15, wherein the thermal interface material is selected from the group consisting of: a solid, a grease, and a gel.

* * * * *